(12) United States Patent
Morzano et al.

(10) Patent No.: US 7,362,619 B2
(45) Date of Patent: Apr. 22, 2008

(54) DATA STROBE SYNCHRONIZATION CIRCUIT AND METHOD FOR DOUBLE DATA RATE, MULTI-BIT WRITES

(75) Inventors: Christopher K. Morzano, Boise, ID (US); Wen Li, Boise, ID (US)

(73) Assignee: Micron Technology, Boise, ID (US)

( * ) Notice: Subject to any disclaimer, the term of this patent is extended or adjusted under 35 U.S.C. 154(b) by 225 days.

(21) Appl. No.: 11/187,058

(22) Filed: Jul. 22, 2005

(65) Prior Publication Data

US 2005/0254336 A1 Nov. 17, 2005

Related U.S. Application Data

(63) Continuation of application No. 10/617,246, filed on Jul. 9, 2003, now Pat. No. 6,922,367.

(51) Int. Cl.
*G11C 7/10* (2006.01)

(52) U.S. Cl. .................. 365/189.05; 365/193; 365/233

(58) Field of Classification Search ............ 365/189.05
See application file for complete search history.

(56) References Cited

U.S. PATENT DOCUMENTS

| | | | |
|---|---|---|---|
| 5,262,998 A | 11/1993 | Mnich et al. | ............... 365/222 |
| 5,563,837 A | 10/1996 | Noguchi | ..................... 365/222 |
| 5,886,932 A | 3/1999 | Choi | ..................... 365/189.09 |
| 5,956,281 A | 9/1999 | Nakai et al. | ................. 365/222 |
| 6,034,916 A | 3/2000 | Lee | .............................. 365/233 |
| 6,064,625 A | 5/2000 | Tomita | ........................ 365/233 |
| 6,081,477 A | 6/2000 | Li | ................................ 365/233 |
| 6,097,658 A | 8/2000 | Satoh et al. | ................. 365/222 |
| 6,188,638 B1 | 2/2001 | Kuhne | ......................... 365/233 |
| 6,201,756 B1 | 3/2001 | Lee | ........................ 365/230.04 |
| 6,215,710 B1 | 4/2001 | Han et al. | .................... 365/193 |
| 6,229,757 B1 | 5/2001 | Nagata et al. | .............. 365/233 |
| 6,288,971 B1 | 9/2001 | Kim | ............................. 265/233 |
| 6,292,410 B1 | 9/2001 | Yi et al. | ..................... 365/193 |
| 6,337,824 B1 | 1/2002 | Kono et al. | ................. 365/207 |
| 6,407,963 B1 | 6/2002 | Sonoda et al. | ........... 365/233.5 |
| 6,466,491 B2 | 10/2002 | Yanagawa | .................... 365/194 |
| 6,529,993 B1 | 3/2003 | Rogers et al. | .............. 711/105 |
| 6,728,162 B2 | 4/2004 | Lee et al. | .................... 365/233 |
| 6,760,261 B2 | 7/2004 | Partsch et al. | ......... 365/189.05 |
| 6,760,856 B1 | 7/2004 | Borkenhagen et al. | ...... 713/401 |
| 6,771,552 B2 | 8/2004 | Fujisawa | ..................... 365/221 |

(Continued)

Primary Examiner—Son L. Mai
(74) Attorney, Agent, or Firm—Dorsey & Whitney LLP

(57) ABSTRACT

A data strobe synchronization circuit includes first and second logic circuits receiving global data strobe pulses and respective enable signal. A control circuit initially applies an enable signal to the first logic circuit so that the first logic circuit generates a first data strobe pulse responsive to each global data strobe pulse. The control circuit receives a write control signal. When the write control signal becomes active, the control circuit terminates the enable signal applied to the first logic circuit and applies an enable signal to the second logic circuit. The second logic circuit then generates a second data strobe pulse responsive to the next global data strobe pulse. The first and second data strobe pulses are used to latch a data signal in respective flip-flops. The data strobe pulses may latch the data signal in pairs of flip-flops on the leading and trailing edges of the data strobe pulses.

18 Claims, 4 Drawing Sheets

U.S. PATENT DOCUMENTS

| | | |
|---|---|---|
| 6,775,190 B2 | 8/2004 | Setogawa ................ 365/193 |
| 6,819,599 B2 | 11/2004 | Schaefer ............ 365/189.07 |
| 6,922,367 B2 * | 7/2005 | Morzano et al. ......... 365/193 |
| 6,934,211 B2 | 8/2005 | Hazama et al. ......... 365/222 |
| 7,031,205 B2 * | 4/2006 | Han et al. ............... 365/193 |
| 7,280,417 B2 * | 10/2007 | Choi et al. .............. 365/193 |
| 2002/0122348 A1 | 9/2002 | Lee et al. ................ 365/233 |
| 2005/0105372 A1 | 5/2005 | Kanda ................ 365/230.06 |
| 2007/0028027 A1 * | 2/2007 | Janzen et al. ................ 711/5 |
| 2007/0053226 A1 | 3/2007 | Lee et al. ............ 365/189.09 |
| 2007/0058459 A1 * | 3/2007 | Kitamura ................ 365/193 |

* cited by examiner

US 7,362,619 B2

DATA STROBE SYNCHRONIZATION CIRCUIT AND METHOD FOR DOUBLE DATA RATE, MULTI-BIT WRITES

CROSS-REFERENCE TO RELATED APPLICATION

This application is a continuation of pending U.S. patent application Ser. No. 10/617,246, filed Jul. 9, 2003, U.S. Pat. No. 6,922,367.

TECHNICAL FIELD

This invention relates to memory devices, and, more particularly to a circuit and method for strobing multiple bits of write data into a double data rate memory device.

BACKGROUND OF THE INVENTION

Memory devices, such as dynamic random access memory ("DRAM") devices, are commonly used in a wide variety of applications, including personal computers. A great deal of effort has been devoted, and is continuing to be devoted, to increasing the speed at which memory devices are able to read and write data. Initially, memory devices operated asynchronously, and a single set of data were read from or written to the memory device responsive to a set of memory commands. The data bandwidth of memory devices were subsequently increased by reading and writing data in synchronism with a clock signal. Synchronously reading and writing data also allowed for other advances in the data bandwidth of memory devices, such as burst mode and page mode DRAMs, in which a large amount of data could be transferred with a single memory command.

Synchronous memory devices such as DRAMs initially transferred data in synchronism with one edge (either rising or falling) of a clock signal each clock cycle. However, with increases in the widths of data paths in synchronous memory devices, it subsequently became possible to transfer data in synchronism with both the rising edge and the falling edge of each clock cycle. As a result, these "double data rate" ("DDR") memory devices transferred data twice each clock cycle. When data is read from or written to a DDR memory device, the data registered with both edges of the clock signal are internally transferred in a single read or write operation. Therefore, although DDR memory devices support twice the data bandwidth of a conventional synchronous memory device, they operate internally at the same speed as a conventional memory device. DDR memory devices are able to provide twice the data bandwidth compared to conventional synchronous memory devices because they have internal data paths that are twice as wide as the data paths in conventional memory devices.

In an attempt to further increase the data bandwidth of memory devices, DDR2 memory devices have been developed. Date are transferred to or from DDR2 memory devices on each edge of two adjacent clock cycles, although, like conventional DDR memory device, data are transferred internally over a relatively wide data path in a single read or write operation. Thus, DDR2 memory devices have twice the data bandwidth of conventional DDR memory devices, which are now known as "DDR1" memory devices.

At high operating speeds, the timing of a data strobe ("DS") signal, which is used to capture write data at data bus terminals can vary somewhat. Therefore, in practice, a data strobe window exists during which data strobe signals are considered valid. The DS window is centered on each edge of a pair of DS pulses and extend before and after each edge by ¼ clock period. During each of these windows, the data applied to a data bus terminal of the memory device must be considered valid.

One problem that may exist with DDR2 memory devices is that noise on the DS line in a "preamble" prior to the first DS pulse may be misinterpreted as a DS pulse, particularly where the DS pulse is substantially delayed relative to the data. As a result, the first and second edges of the first DS pulse, (i.e., $DS_0$ and $DS_1$) will be interpreted as the third and fourth data strobe transitions $DS_2$ and $DS_3$, and the true $DS_2$ and $DS_3$ transitions will be ignored. Under these circumstances, the incorrect write data may be strobed into the memory device.

There is therefore a need for a circuit and method that is substantially immune to noise on the data strobe line of DDR2 memory devices to avoid capturing spurious data.

SUMMARY OF THE INVENTION

A data strobe synchronization circuit generates first data strobe signals responsive to global data strobe signals, but does not generate a second data strobe signal responsive to a global data strobe signal until a write control signal is generated. The data strobe signals are used to store respective samples of a data signal in respective storage devices so that data signal samples obtained responsive to the first data strobe signals are overwritten with data signal samples obtained responsive to subsequent data strobe signals. When the write control signal is generated, the first data strobe signals are no longer generated responsive to the global data strobe signals. As a result, a data signal sample last obtained prior to the write control signal being generated is saved and a data signal sample obtained after the write control signal is saved.

DETAILED DESCRIPTION OF THE INVENTION

Figure 1:
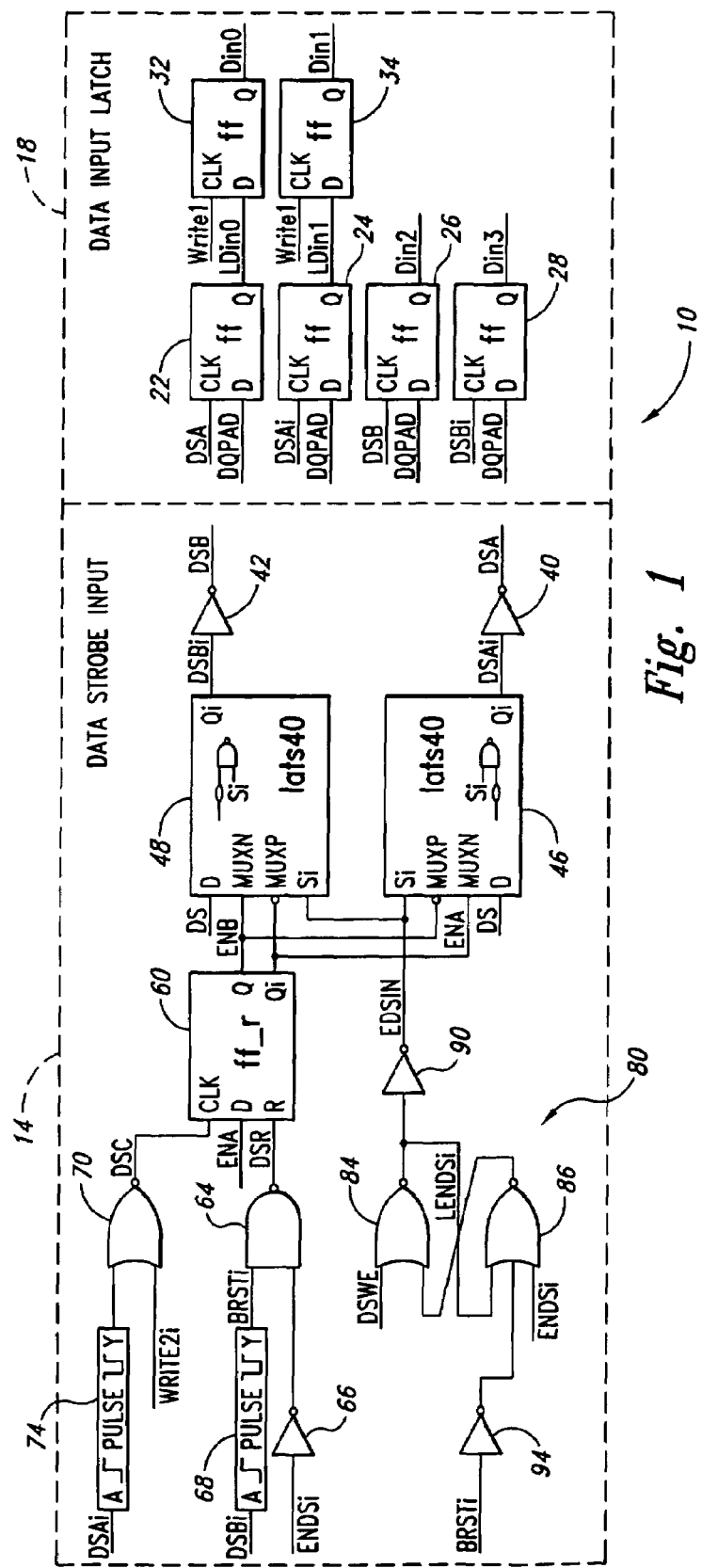
FIG. 1 is a logic diagram a data strobe circuit and method according to one embodiment of the invention.

One embodiment of a data strobe circuit 10 that is insensitive to noise on data strobe lines and thus captures write data responsive only to valid data strobes is shown in FIG. 1. As explained more fully below, the circuit 10 operates by strobing data on each transition of a DS pulse on a data strobe DS line, saving the data strobed on the last two transitions prior to a predetermined write command, and saving the data strobed on the first two transitions following the predetermined write command. As a result, any data strobed by noise signals in the preamble are overwritten with correctly strobed data.

With reference to FIG. 1, the data strobe circuit 10 includes a data strobe input circuit 14 and a data input latch circuit 18. As described in greater detail below, the data strobe input circuit 14 functions to generate data strobe signals, and the data input latch circuit 18 uses those strobe signals to latch four bits of write data.

The data input latch circuit 18 includes 4 flip-flops 22, 24, 26, 28 each of which includes a data ("D") input coupled to a respective DQPAD line. The DQPAD lines to of all of the flip-flops 22-28 are coupled to a common data bus terminal (not shown). The flip-flops 22-28 are clocked by a respective data strobe signal, DSA, DSAi, DSB, DSBi, where the "i" designates a complement signal. Thus, DSAi is the complement of DSA. As explained below, the DSA, DSAi, DSB and DSBi signals are generated by the data strobe input circuit 14. The DSA signal is the data strobe for the first data bit, the DSAi signal is the data strobe for the second data bit, the DSB signal is the data strobe for the third data bit, and the DSBi signal is the data strobe for the fourth data bit. Thus, after all of these data strobe signals have occurred, the collective write data for a single write cycle are captured by the flip-flops 22-28.

The first and second write data bits are applied as Ldin0 and Ldin1 signals to the data inputs of respective flip-flops 32, 34. The flip-flops 32, 34 are clocked by a Write1 signal, which is conventionally generated in DDR2 memory devices one clock cycle before the write data are written to an array of memory cells in the memory device. The flip-flops 32, 34 then output respective first and second bits of write data, Din0 and Din1, respectively. The third and fourth bits of write data, Din2 and Din3, are output directly from the flip-flops 26, 28 at about the same time that the Write1 signal becomes active. The flip-flops 32, 34 are used to output the first and second bits of write data to the memory array so that all four bits of write data will be presented to the memory array at substantially the same time.

As mentioned previously, the data input latch circuit 18 generates the data strobe signals, DSA, DSAi, DSB and DSBi at the proper time, and it does so in a manner that does not result in the capture of data responsive to noise signals. The DSA signal is generated by an inverter 40 from its complimentary DSAi signal, and the DSB signal is similarly generated by an inverter 42 from its complimentary DSBi signal. The DSAi and DSBi signals are, in turn, generated by respective logic circuits 46, 48. The function of the logic circuits 46, 48 is to pass a global data strobe DS signal whenever the logic circuit 46, 48 is enabled by a high enable data strobe input ("EDSIN") signal and either the logic circuit 46 or the logic circuit 48 is selected by a high ENA or ENB signal, respectively.

Figure 2:
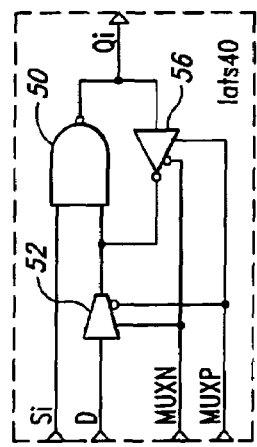
FIG. 2 is a logic diagram of one embodiment of a logic circuit used in the data strobe circuit of FIG. 1.

One embodiment of the logic circuit 46, 48 is illustrated in FIG. 2. The logic circuit 46, 48 includes a NAND gate 50 that is enabled by a high Si input, which, as shown in FIG. 1, is coupled to receive the EDSIN signal. As explained in greater detail below, the EDSIN signal is switched to active high by a write enable signal and is switched to inactive low when 4 bits of data have been captured by the data strobe signals DSA, DSAi, DSB and DSBi, respectively.

The other input to the NAND gate 50 is coupled to the output of a multiplexer 52 that receives the data strobe DS signal at its data input and is enabled by an active high MUXN signal and an active low MUXP signal. As shown in FIG. 1, the MUXN signal is active high and the MUXP signal is active low whenever the ENA or ENB signal coupled to the logic circuits 46, 48, respectively, is active high. Thus, the output of the NAND gate 50 will be the compliment of the DS signal whenever the EDSIN signal is active high and the respective enable signal ENA or ENB is high. The output of the NAND gate is coupled to the multiplexer input to the NAND gate 50 by an inverter 56 so that the output of the NAND gate 50 will be latched after the multiplexer 52 is disabled. The latched output of the NAND gate 50 is reset high when the EDSIN signal transitions low as described below.

Returning to FIG. 1, since the logic circuits 46, 48, the ENA and ENB signals that enable the logic circuits 46, 48 are generated by a flip-flop 60. However, since the active high MUXN for the logic circuit 46 is coupled to the Qi output of the flip-flop 60 and the active high MUXN for the logic circuit 48 is coupled to the Q output of the flip-flop 60, the logic circuits 46, 48 are alternatively enabled. More specifically, when the flip-flop 60 is reset, the logic circuit 46 is enabled. Setting the flip-flop 60 then enables the logic circuit 48.

The flip-flop 60 is reset by a high at the output of a NAND gate 64, which occurs whenever either input to the NAND gate 64 is low. An active low enable data strobe ENDSI signal is normally low, so an inverter 66 normally enables the NAND gate 64. The other input to the NAND gate 64 is coupled to a pulse generator 68, which outputs a low-going pulse responsive to a rising edge of the DSBi signal. As explained above, the DSBi signal is generated by the logic circuit 48, and it transitions high upon strobing the fourth data bit into the flip-flop 28. Thus, the flip-flop 60 is reset to enable the logic circuit 46 when the logic circuit 48 outputs the data strobe signal DSBi to strobe the fourth bit of data.

The flip-flop 60 is clocked by a DSC signal at the output of a NOR gate 70. The signal applied to the data D input of the flip-flop 60 is the ENA signal that is generated at the Qi output of the flip-flip 60. Therefore, the flip-flop 60 toggles when clocked by the output of the DSC signal. The NOR gate 70 is enabled by an active low Write2i signal, which is generated 2 clock periods before data are written to a memory array in a memory device containing the data strobe circuit 10. When enabled 2 clock periods before a data write operation, the flip-flop 60 is clocked by a pulse from a pulse generator 74, which occurs on the rising edge of the DSAi signal. As explained above, the DSAi signal is used to latch the second bit of data into the flip-flop 24. The DSAi signal transitions high when the DS signal applied to the logic circuit 46 transitions low and the logic circuit 46 is enabled. Thus, the logic circuit 46 is initially enabled so that the DSA and DSAi signals are continuously generated from the DS signal. The trailing edges of the DSAi pulses cause the pulse generator 74 to apply respective pulses to the NOR gate 70. However, these pulses are ignored until 2 clock periods before a write operation because the Write2i signal is inactive high. When the Write2i signal becomes active low, the rising edge of the next DSAi pulse causes a DSC pulse to be generated, which toggles the flip-flop 60 to enable the logic circuit 48. The logic circuit 48 then generates the DSB and DSBi signals from the next two transitions of the DS signal. As previously explained, these DSB and DSBi signals latch the third and fourth bits of data into the flip-flops 26, 28, respectively. The rising edge of the DSBi signal used to latch the fourth bit of data triggers the pulse generator 68 to generate a pulse that resets the flip-flop 60 to again enable the logic circuit 46. In summary, when the Write2i signal becomes active, the data strobe circuit 10 strobes the two bits of data into the flip-flops 22, 24, respectively, on the last two DS transitions prior to the Write2i signal becoming active. The data strobe circuit 10 then strobes the next two bits of data into the flip-flops 26, 28, respectively.

As mentioned above the logic circuits 46, 48 are enabled by an EDSIN signal applied to their Si inputs. The EDSIN signal is generated by a flip-flop 80 formed by two NOR gates 84, 86, the output of which is coupled through an inverter 90. The flip-flop 80 is set to enable the logic circuit 46, 48 by applying a high data strobe write enable DSWE signal to the NOR gate 84. The flip-flop 80 is reset to disable the logic circuits 46, 48 and reset their outputs high either applying an active low BRSTi signal to an inverter 94 or by applying an inactive high ENDSi signal to the NOR gate 86. However, as mentioned above, the ENDSi signal is normally active low during the operation of the data strobe circuit 10, so the NOR gate 86 is normally enabled. A low transitioning BRSTi pulse, which resets the flip-flop 80, is generated at the output of the pulse generator 68 whenever the DSBi signal transitions high. As previously explained, this occurs when the fourth bit of data is latched into the flip-flop 28. However, since the DSWE is normally high when the data strobe circuit 10 is active, these BRSTi pulses do not reset the flip-flop 80 to disable the logic circuits 46, 48. However, when the data strobe circuit 10 is to be disabled for a write operation, the DSWE signal transitions low to allow the BRSTi pulse to be generated when the fourth bit of data has been strobed into the flip-flop 28.

Figure 3:
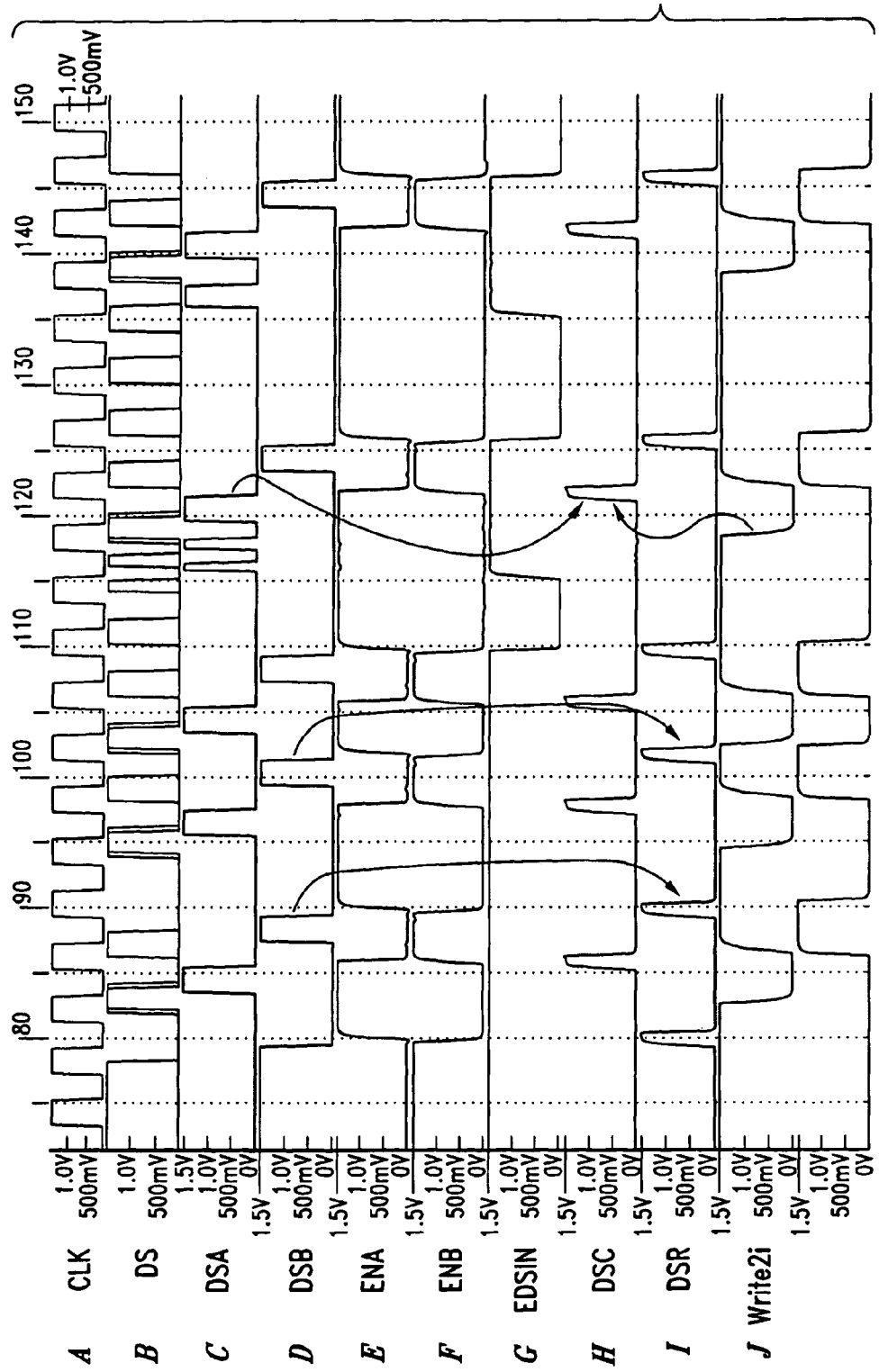
FIGS. 3A-J are timing diagrams showing various signals present in the data strobe circuit of FIG. 1.

The operation of the entire data strobe circuit 10 will now be explained with reference to the timing diagram shown in FIG. 3, which shows various signals present in the circuit of FIG. 2 over a 150 ns time period as indicated at the top of FIG. 3. FIG. 3A shows a clock signal that provides the basic timing for a memory device (not shown) containing the data strobe circuit 10 of FIG. 1. FIG. 3B shows a data strobe signal DS having several pulse pairs each of which is used for strobing 4 bits of data into the memory device. As further shown in FIG. 3B, a pair of noise pulses occur on the DS line starting at about 115 ns. As explained above, the logic circuit 46 is initially enabled so that each DS pulse shown in FIG. 3B causes a DSA pulse to be generated, as shown in FIG. 3C. This DSA pulse latches the first and second data bits into the flip-flops 22, 24, respectively. When each DSA pulse is generated, the Write2i signal shown in FIG. 3J is active low so that the falling edge of the DSA pulse (the rising edge of the DSAi pulse) causes a DSC pulse to be generated at the output of the NOR gate 70, as shown in FIG. 3H. Each of these DSC pulses toggles the flip-flop 60, thereby disabling the logic circuit 46 and enabling the logic circuit 48. As a result, the subsequent DS pulse causes a DSB pulse to be generated, as shown In FIG. 3D. Each DSB pulse latches the third and fourth data bits into the flip-flops 26, 28, respectively, and causes a DSR pulse to be generated at the output of the NAND-gate 64, as shown in FIG. 3I. This DSC pulse resets the flip-flop 60, thereby enabling the logic circuit 46 and disabling the logic circuit 48 so that the subsequent DS pulse generates a DSA pulse rather than a DSB pulse, as explained above.

The manner in which the data strobe circuit 10 is insensitive to noise pulses on the data strobe line DS will now be explained with reference to FIGS. 1 and 3. When the noise pulses are generated between 115-120 ns, they each cause a DSA pulse to be generated as shown in FIG. 3C, which latches data into the flip-flops 22, 24. However, when the first true DS pulse occurs at the 120 ns time, the spurious data latched into the flip-flops 22, 24 is overwritten with data latched by the leading and trailing edges of this DS pulse. Significantly, the noise pulses do not toggle the flip-flop 60, which would result in the disabling of the logic circuit 46 and enabling of the logic circuit 48. If the logic circuit 48 was enabled, the true DS signal would generate a DSB pulse, which would latch the first and second data bits into the flip-flops 26, 28 for the third and fourth data bits. The reason why the noise pulses do not toggle the flip-flop 60 is that the Write2i signal shown in FIG. 3J is inactive high when the noise pulses are present. As a result, the falling edge of the DSA signal is not coupled through the nor gate 70, and it therefore cannot clock the flip-flop 60. Thus, the first DS pulse occurring after the noise pulses causes the first and second data bits to be latched into the flip-flop 22, 24, and the second DS pulse occurring after the noise pulses causes the third and fourth data bits to be latched into the flip-flops 26, 28. The data strobe circuit 10 is thus insensitive to noise pulses in the preamble prior to the first DS pulse.

Figure 4:
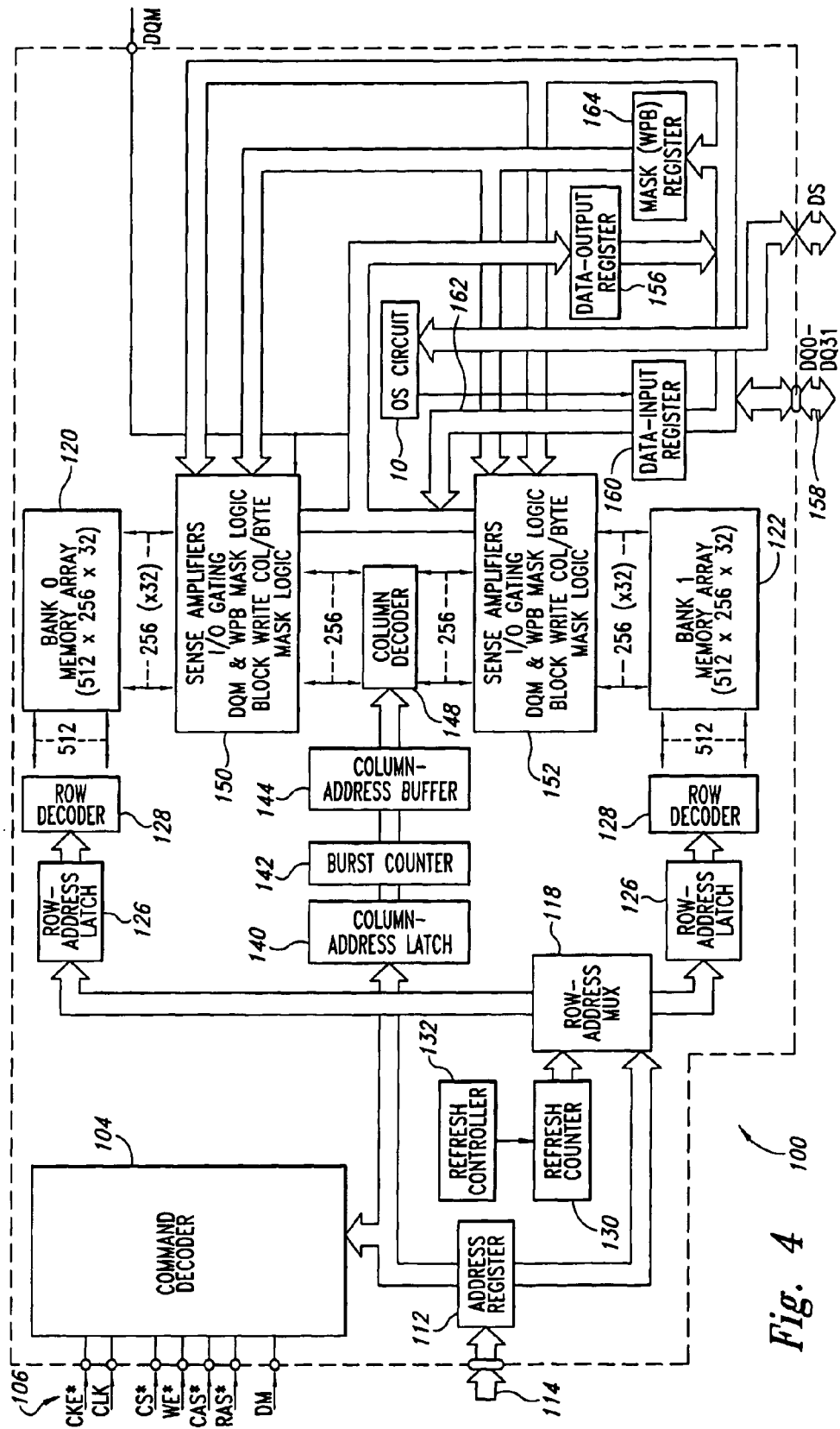
FIG. 4 is a block diagram of one embodiment of a memory device using the data strobe circuit of FIG. 1.

One embodiment of a memory device using the data strobe circuit 10 of FIG. 1 or some other embodiment of the invention is shown in FIG. 4. The memory device illustrated therein is a synchronous dynamic random access memory ("SDRAM") 100, although the invention can be embodied in other types of synchronous DRAMs, such as packetized DRAMs and RAMBUS DRAMs (RDRAMS"), as well as other types of digital devices. The SDRAM 100 includes an address register 112 that receives either a row address or a column address on an address bus 114. The address bus 114 is generally coupled to a memory controller (not shown in FIG. 4). Typically, a row address is initially received by the address register 112 and applied to a row address multiplexer 118. The row address multiplexer 118 couples the row address to a number of components associated with either of two memory arrays 120, 12 depending upon the state of a bank address bit forming part of the row address.

Associated with each of the memory arrays 120, 122 is a respective row address latch 126, which stores the row address, and a row decoder 128, which applies various signals to its respective array 120 or 122 as a function of the stored row address. These signals include word line voltages that activate respective rows of memory cells in the memory arrays 120, 122. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132.

After the row address has been applied to the address register 112 and stored in one of the row address latches 126, a column address is applied to the address register 112. The address register 112 couples the column address to a column address latch 140. Depending on the operating mode of the SDRAM 100, the column address is either coupled through a burst counter 142 to a column address buffer 144, or to the burst counter 142 which applies a sequence of column addresses to the column address buffer 144 starting at the column address output by the address register 112. In either case, the column address buffer 144 applies a column address to a column decoder 148 which applies various signals to respective sense amplifiers and associated column circuitry 150, 152 for the respective arrays 120, 122.

Data to be read from one of the arrays 120, 122 is coupled to the column circuitry 150, 152 for one of the arrays 120, 122, respectively. The data is then coupled through a read data path 154 to a data output register 156, which applies the data to a data bus 158.

Data to be written to one of the arrays 120, 122 is coupled from the data bus 158 through a data input register 160 and a write data path 162 to the column circuitry 150, 152 where it is transferred to one of the arrays 120, 122, respectively. The data strobe circuit 10 is coupled to the data input register 160 to latch four bits of data sequentially applied to the data bus 158 responsive to an externally generated data strobe ("DS") signal. These four bits of data are then coupled through the write data path 162 to the column circuitry 150, 152. A mask register 164 may be used to selectively alter the flow of data into and out of the column circuitry 150, 152, such as by selectively masking data to be read from the arrays 120, 122.

The above-described operation of the SDRAM 100 is controlled by a command decoder 104 responsive to command signals received on a control bus 170. These high level command signals, which are typically generated by a memory controller (not shown in FIG. 4), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 104 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 5:
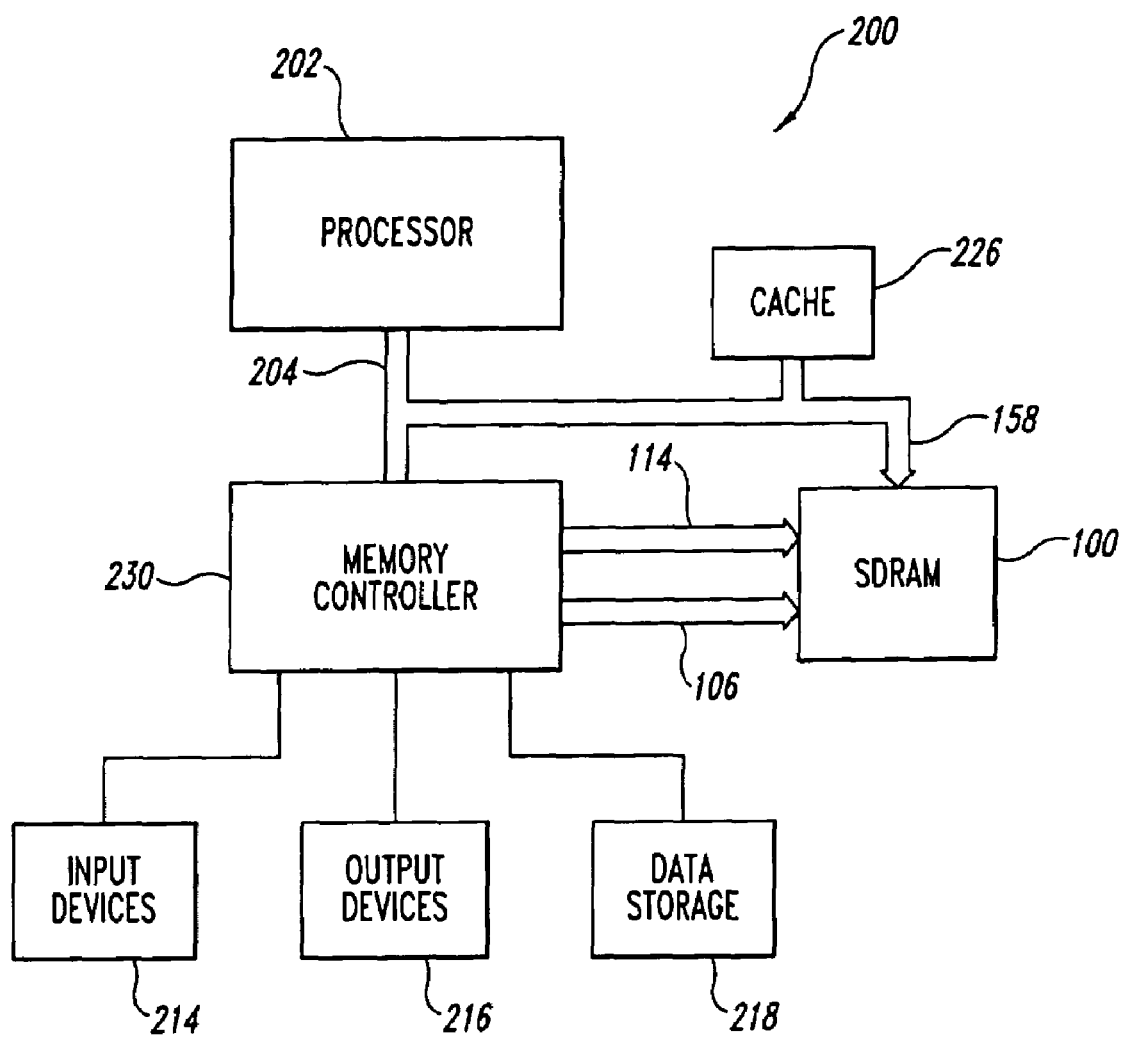
FIG. 5 is a block diagram of one embodiment of a computer system using the memory device of FIG. 4.

FIG. 5 shows a computer system 200 containing the SDRAM 100 of FIG. 4. The computer system 200 includes a processor 202 for performing various computing functions, such as executing specific software to perform specific calculations or tasks. The processor 202 includes a processor bus 204 that normally includes an address bus, a control bus, and a data bus, which includes the data strobe signal. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory (37 SRAM"), and to the SDRAM 100 through a memory controller 230. The memory controller 230 normally includes the control bus 106 (FIG. 4) and the address bus 114 that are coupled to the SDRAM 100. The data bus 158 is coupled from the SDRAM 100 to the processor bus 204 either directly (as shown), through the memory controller 230, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of capturing data in a storage device, the method comprising:
generating a first data strobe pulse responsive to a first global strobe pulse, the first data strobe pulse causing a first storage device to capture a first set of data;
generating a second data strobe pulse responsive to the first data strobe pulse and an active write command; and
in response to the second data strobe pulse, preventing the first storage device from capturing a second set of data.

2. The method of claim 1 wherein the first storage device comprises a flip flop.

3. The method of claim 1 wherein preventing the first storage device from capturing a second set of data comprises disabling a logic circuit.

4. The method of claim 1 wherein the second set of data is a noise pulse.

5. The method of claim 1 further comprising the second data strobe pulse causing a second storage device to capture a second set of data.

6. A method of toggling between logic circuits comprising:
enabling a first write control signal;
generating a first data strobe pulse in response to a first data strobe signal;
in response to the first data strobe pulse, enabling a first logic circuit;
enabling a second write control signal;
while the second write control signal remains enabled, generating a second data strobe pulse in response to a second data strobe signal; and
in response to the second data strobe pulse enabling a second logic circuit.

7. The method of claim 6 wherein in response to the second data strobe pulse further comprises disabling the first logic circuit.

8. The method of claim 6 further comprising capturing data to at least one storage device when the write control signal is enabled.

9. The method of claim 6 wherein the first and second data strobe signals are generated in response to a global data signal respectively.

10. The method of claim 6 wherein the first data strobe signal causes data to be latched to a first storage device and the second data strobe signal causes data to be latched to a second storage device.

11. A method of preventing noise pulses from toggling a logic circuit comprising:
latching data to a first storage device in response to each of a plurality of global data strobe pulses;
in response to a first active write command, discontinuing to latch data to the first storage device and latching data to a second storage device in response to a respective global data strobe pulse.

12. The method of claim 11 wherein at least one of the plurality of global data strobe pulses comprises a noise signals.

13. The method of claim 12 further comprising in response to a second active write command, discontinuing to latch data to the second storage device.

14. The method of claim 11 wherein the first and second storage device comprises a first and second flip flop respectively.

15. A method of storing data in a memory device, the method comprising:
saving data responsive to each transition of a data strobe signal;
in response to receiving a first memory control signal, discarding all of the saved data except for the data saved responsive to a predetermined number of transitions of the data strobe signal received prior to the first memory control signal; and
storing the saved data that was not discarded in the memory device.

16. The method of claim 15, further comprising storing data in the memory device responsive to each transition of the data strobe signal occurring after the first memory control signal is received.

17. The method of claim 16 wherein the act of storing data in the memory device responsive to each transition of the data strobe signal occurring after the first memory control signal is received comprises storing data in the memory device responsive to two transition of the data strobe signal occurring immediately after the first memory control signal is received.

18. The method of claim 15 wherein the act of discarding all of the saved data except for the data saved responsive to a predetermined number of transitions of the data strobe signal received prior to the first memory control signal comprises discarding all of the saved data except for the data saved responsive to two transitions of the data strobe signal received prior to the first memory control signal.

* * * * *